(12) United States Patent
Heckel et al.

(10) Patent No.: US 11,177,412 B2
(45) Date of Patent: Nov. 16, 2021

(54) SPUTTER DEPOSITION APPARATUS INCLUDING ROLLER ASSEMBLY AND METHOD

(71) Applicant: BEIJING APOLLO DING RONG SOLAR TECHNOLOGY CO., LTD., Beijing (CN)

(72) Inventors: Thomas Heckel, Mountain View, CA (US); Heinrich von Bunau, San Jose, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 105 days.

(21) Appl. No.: 16/390,670

(22) Filed: Apr. 22, 2019

(65) Prior Publication Data

US 2020/0335654 A1 Oct. 22, 2020

(51) Int. Cl.
| | |
|---|---|
| *C23C 14/56* | (2006.01) |
| *C23C 14/54* | (2006.01) |
| *H01L 31/18* | (2006.01) |
| *H01L 31/032* | (2006.01) |
| *C23C 14/34* | (2006.01) |

(Continued)

(52) U.S. Cl.
CPC .............. *H01L 31/18* (2013.01); *C23C 14/34* (2013.01); *C23C 14/541* (2013.01); *C23C 14/568* (2013.01); *H01J 37/3488* (2013.01); *H01L 31/0322* (2013.01); *H01J 2237/204* (2013.01); *H01L 31/0749* (2013.01)

(58) Field of Classification Search
CPC . H01L 31/18; H01L 31/0322; H01L 31/0749; C23C 14/34; C23C 14/568; C23C 14/541; C23C 14/50; C23C 14/562; H01J 37/3488; H01J 2237/204; Y02E 10/541
USPC ....................................... 204/298.24; 118/718
See application file for complete search history.

(56) References Cited

U.S. PATENT DOCUMENTS

| | | | |
|---|---|---|---|
| 5,879,741 A | * | 3/1999 | Itoh .......................... C23C 14/50 427/172 |
| 9,105,778 B2 | | 8/2015 | Krein et al. |
| 9,303,316 B1 | | 4/2016 | Shufflebotham et al. |

(Continued)

FOREIGN PATENT DOCUMENTS

| | | | |
|---|---|---|---|
| JP | 2001002434 A | * | 1/2001 |
| WO | WO-2010121815 A1 | * | 10/2010 ............. C25D 17/06 |

OTHER PUBLICATIONS

NSK, Needle Roller Bearings, 2007 (Year: 2007).*

(Continued)

*Primary Examiner* — James Lin
*Assistant Examiner* — Patrick S Ott
(74) *Attorney, Agent, or Firm* — The Marbury Law Group PLLC

(57) ABSTRACT

A sputter deposition method includes sputtering a first target material onto a web substrate moving through a first process module while heating the substrate, providing the substrate from the first process module to a connection unit containing a roller assembly including a plurality of cylindrical rollers, bending the substrate at an angle of 10° to 40° around the roller assembly in the connection unit, providing the substrate from the connection unit to a second process module, and sputtering a second target material onto the substrate moving through the second process module while heating the substrate.

9 Claims, 10 Drawing Sheets

(51) Int. Cl.
*H01J 37/34* (2006.01)
*H01L 31/0749* (2012.01)

(56) References Cited

U.S. PATENT DOCUMENTS

| | | | |
|---|---|---|---|
| 10,062,801 B2 | 8/2018 | Poplavskyy | |
| 2001/0040097 A1* | 11/2001 | Arao | B65H 23/105 |
| | | | 205/82 |
| 2006/0278497 A1* | 12/2006 | White | C23C 14/568 |
| | | | 198/339.1 |
| 2012/0291958 A1* | 11/2012 | Yamada | C23C 16/545 |
| | | | 156/580 |
| 2014/0141562 A1* | 5/2014 | Li | H01L 21/67161 |
| | | | 438/95 |
| 2014/0367250 A1* | 12/2014 | Hachtmann | H01J 37/3455 |
| | | | 204/298.11 |
| 2017/0317227 A1 | 11/2017 | Poplavskyy | |
| 2018/0037981 A1* | 2/2018 | Tas | C23C 14/548 |

OTHER PUBLICATIONS

Xiaolan Ai, Self-Aligning Bearings, 2013, Encyclopedia of Tribology, p. 2995-2997 (Year: 2013).*
WO-2010121815-A1 Machine Translation (Year: 2010).*
JP-2001002434-A Machine Translation (Year: 2001).*
U.S. Appl. No. 16/028,149, filed Jul. 5, 2018, Beijing Apollo Ding Rong Solar Technology Co., Ltd.
U.S. Appl. No. 16/028,165, filed Jul. 5, 2018, Beijing Apollo Ding Rong Solar Technology Co., Ltd.

* cited by examiner

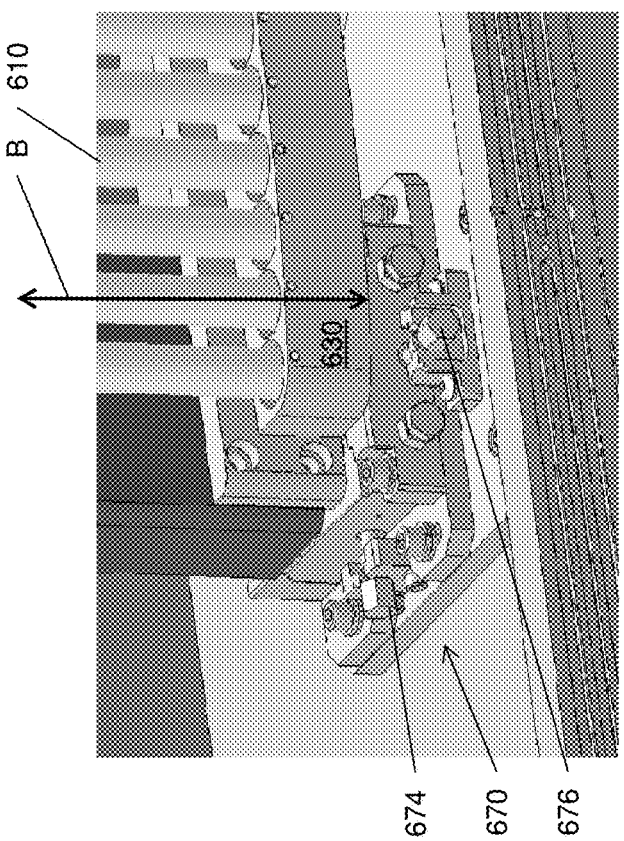
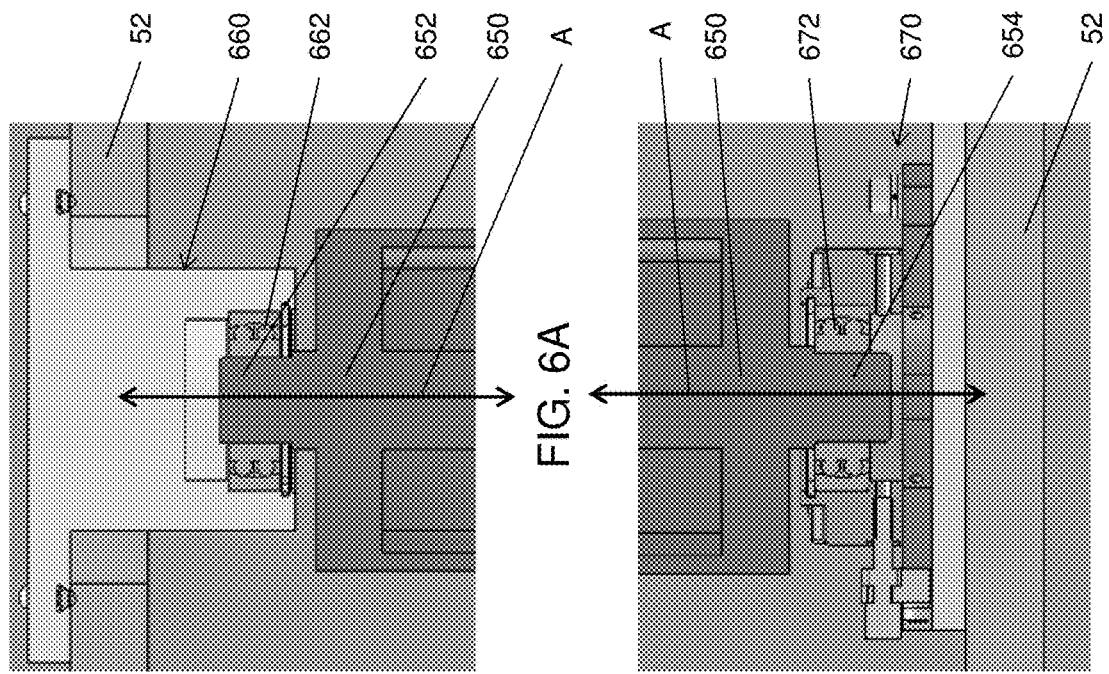
FIG. 6A  FIG. 6B  FIG. 6C

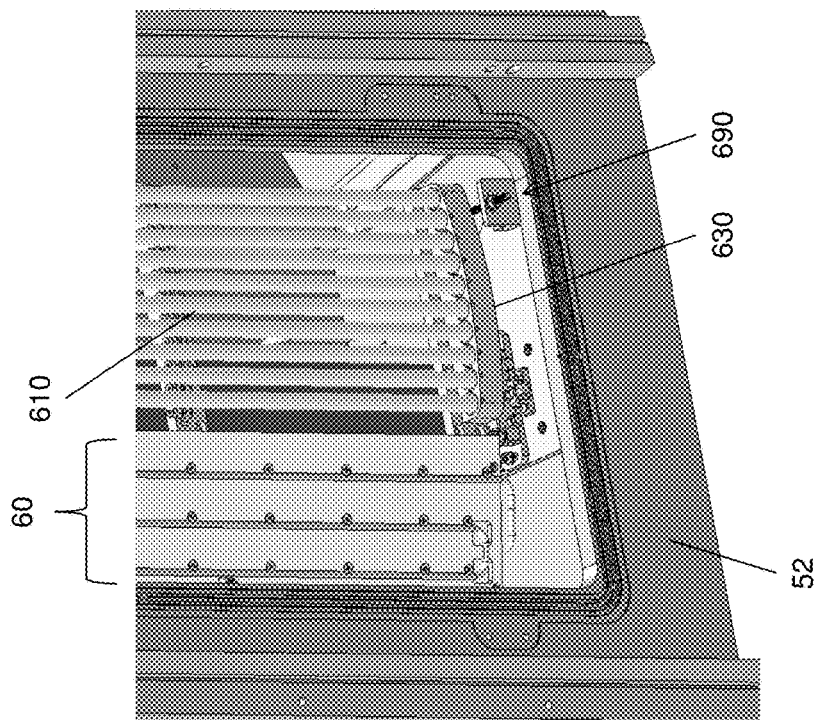
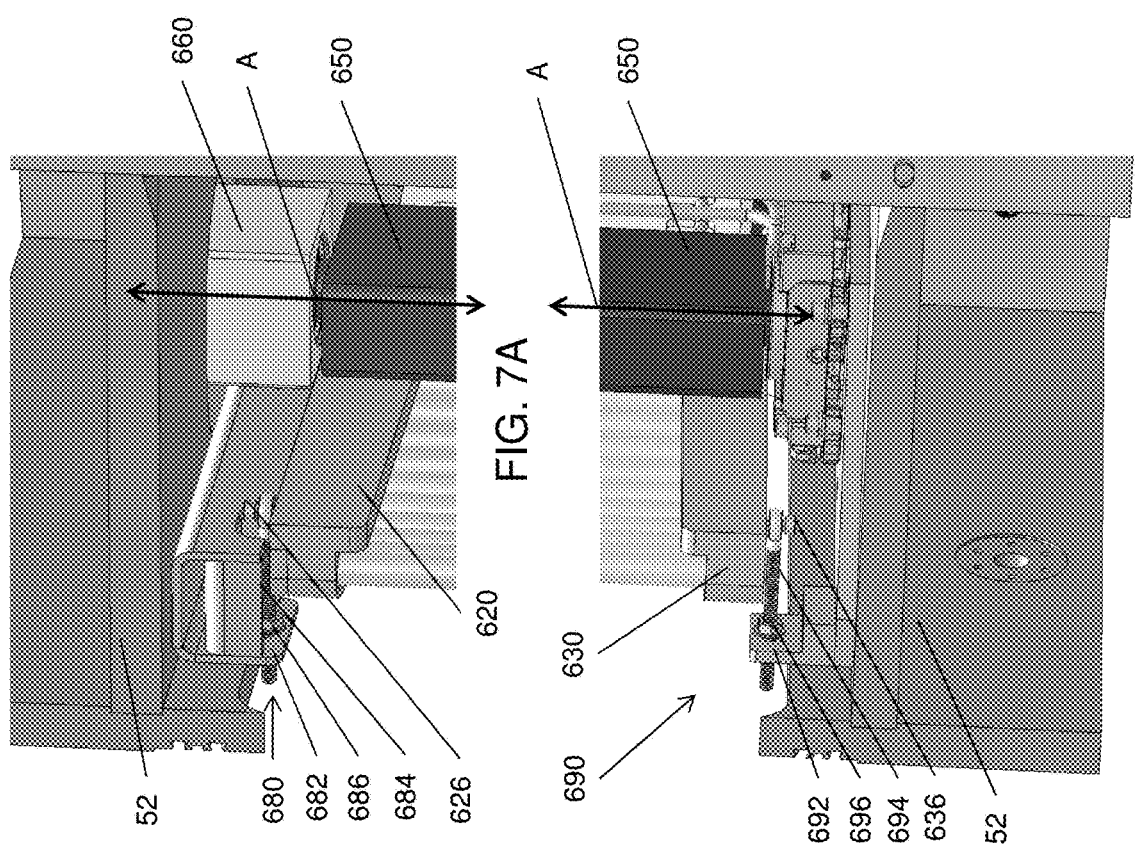

SPUTTER DEPOSITION APPARATUS INCLUDING ROLLER ASSEMBLY AND METHOD

BACKGROUND

The present disclosure is directed generally to a sputter deposition apparatus including a roller assembly and method of using the same to during a sputtering deposition process.

A "thin-film" photovoltaic material refers to a polycrystalline or amorphous photovoltaic material that is deposited as a layer on a substrate that provides structural support. The thin-film photovoltaic materials are distinguished from single crystalline semiconductor materials that have a higher manufacturing cost. Some of the thin-film photovoltaic materials that provide high conversion efficiency include chalcogen-containing compound semiconductor material, such as copper indium gallium selenide ("CIGS").

Thin-film photovoltaic cells (also known as photovoltaic cells) may be manufactured using a roll-to-roll coating system based on sputtering, evaporation, or chemical vapor deposition (CVD) techniques. A thin foil substrate, such as a foil web substrate, is fed from a roll in a linear belt-like fashion through the series of individual vacuum chambers or a single divided vacuum chamber where it receives the required layers to form the thin-film photovoltaic cells. In such a system, a foil having a finite length may be supplied on a roll. The end of a new roll may be coupled to the end of a previous roll to provide a continuously fed foil layer.

SUMMARY

According to various embodiments, a thin film deposition system comprises first and second process modules configured to form a film on a substrate comprising a web substrate having a width and configured to move through the first and second process modules in a direction perpendicular to the width, a connection unit configured to receive the substrate from the first process module at a first angle and provide the substrate to the second process module at a second angle different from the first angle, the connection unit comprising a first vacuum chamber configured to receive the substrate from the first process module, and a roller assembly disposed in the first vacuum chamber and configured to bend a portion of the substrate as the substrate moves through the first vacuum chamber. The roller assembly comprises a rotatable and laterally movable support disposed in the first vacuum chamber and cylindrical rollers supported by the support, wherein the rollers have a first axis of rotation parallel to the width of the substrate and wherein the rollers are arranged in an arc having a radius of curvature of at least about 10", such that the bent portion of the substrate is configured to have radius of curvature of at least about 10".

According to various embodiments, a sputter deposition method includes sputtering a first target material onto a web substrate moving through a first process module while heating the substrate, providing the substrate from the first process module to a connection unit containing a roller assembly including a plurality of cylindrical rollers, bending the substrate at an angle of 10 to 40 degrees around the roller assembly in the connection unit, providing the substrate from the connection unit to a second process module, and sputtering a second target material onto the substrate moving through the second process module while heating the substrate.

BRIEF DESCRIPTION OF THE DRAWINGS

FIG. 6A is a schematic view showing the connection of the upper alignment post 652 and the vacuum chamber 52, FIG. 6B is a schematic view showing the connection of the lower alignment post 654 and the vacuum chamber 52, and FIG. 6C is a perspective view of a lower post bracket 670 and a bottom portion of the roller assembly 600, according to various embodiments of the present disclosure.

FIG. 7A is a perspective view showing an upper adjustment mechanism 680 for the upper bracket 620, FIG. 7B is a perspective view showing a lower adjustment mechanism 690 for the lower bracket 630, and FIG. 7C is another perspective view showing an adjustment mechanism for the lower bracket 630, according to various embodiments of the present disclosure.

DETAILED DESCRIPTION

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a direct physical contact between a surface of the first element and a surface of the second element.

The present disclosure is directed to an apparatus and method for forming photovoltaic devices on a web substrate. In particular, the present disclosure relates to an apparatus and method for selectively depositing layers of a photovoltaic device on a web substrate while reducing substrate deformation. The web substrate typically has a width (i.e., a height of the web substrate for a vertically positioned web substrate, which is perpendicular to the length (i.e., movement direction) of the web substrate) of at least 10 cm, and oftentimes a width of about 1 meters or more, such as 1 to 5 meters. Deposition of a film with a uniform thickness and/or composition as a function of a large web substrate width is a challenge even in a large deposition chamber. Particularly, the web should be as flat (e.g., planar) as possible to promote consistent deposition.

Figure 1:
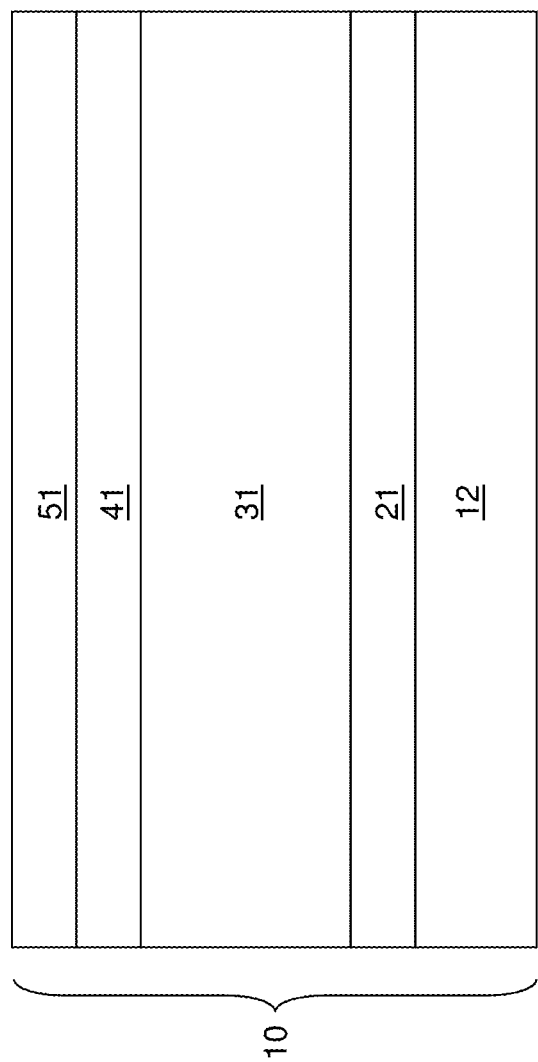
FIG. 1 is a schematic vertical cross sectional view of a thin-film photovoltaic cell, according to various embodiments of the present disclosure.

Referring to FIG. 1, a vertical cross-sectional view of a photovoltaic cell 10 is illustrated. The photovoltaic cell 10 includes a substrate, such as an electrically conductive substrate 12, a first electrode 21, a p-doped semiconductor layer 31, an n-doped semiconductor layer 41, a second electrode 51, and an optional antireflective (AR) coating layer (not shown).

The substrate 12 is preferably a flexible, electrically conductive material, such as a metallic foil that is fed into a system of one or more process modules as a web for deposition of additional layers thereupon. For example, the conductive substrate 12 can be a sheet of a metal or a metallic alloy such as stainless steel, aluminum, or titanium. In various embodiments, the substrate 12 may be ferromagnetic. If the substrate 12 is electrically conductive, then it may comprise a part of the back side (i.e., first) electrode of the cell 10. Thus, the first (back side) electrode of the cell 10 may be designated as (21, 12). Alternatively, the substrate 12 may be an electrically conductive or insulating polymer foil. Still alternatively, the substrate 12 may be a stack of a polymer foil and a metallic foil. The thickness of the substrate 12 can be in a range from 25 microns to 1 mm, although lesser and greater thicknesses can also be employed.

The first or back side electrode 21 may comprise any suitable electrically conductive layer or stack of layers. For example, electrode 21 may include a metal layer, which may be, for example, molybdenum. Alternatively, a stack of molybdenum and sodium and/or oxygen doped molybdenum layers may be used instead, as described in U.S. Pat. No. 8,134,069, which is incorporated herein by reference in its entirety. In another embodiment, the first electrode 21 can include a molybdenum material layer doped with K and/or Na, i.e., $MoK_x$ or $Mo(Na,K)_x$, in which x can be in a range from $1.0 \times 10^{-6}$ to $1.0 \times 10^{-2}$. The electrode 21 can have a thickness in a range from 500 nm to 1 micron, although lesser and greater thicknesses can also be employed.

The p-doped semiconductor layer 31 can include a p-type sodium doped copper indium gallium selenide (CIGS), which functions as a semiconductor absorber layer. The thickness of the p-doped semiconductor layer 31 can be in a range from 1 microns to 5 microns, although lesser and greater thicknesses can also be employed.

The n-doped semiconductor layer 41 includes an n-doped semiconductor material such as CdS, ZnS, ZnSe, or an alternative metal sulfide or a metal selenide. The thickness of the n-doped semiconductor layer 41 is typically less than the thickness of the p-doped semiconductor layer 31, and can be in a range from 30 nm to 100 nm, although lesser and greater thicknesses can also be employed. The junction between the p-doped semiconductor layer 31 and the n-doped semiconductor layer 41 is a p-n junction. The n-doped semiconductor layer 41 can be a material which is substantially transparent to at least part of the solar radiation. The n-doped semiconductor layer 41 is also referred to as a window layer or a buffer layer.

The second (e.g., front side or top) electrode 51 comprises one or more transparent conductive layers 51. The transparent conductive layer 51 is conductive and substantially transparent. The transparent conductive layer 51 can include one or more transparent conductive materials, such as ZnO, indium tin oxide (ITO), Al doped ZnO ("AZO"), Boron doped ZnO ("BZO"), or a combination or stack of higher resistivity AZO and lower resistivity ZnO, ITO, AZO and/or BZO layers. The second electrode 51 contacts an electrically conductive part (e.g., a metal wire or trace) of an interconnect, such as an interconnect described in U.S. Pat. No. 8,912,429, issued Dec. 16, 2014, which is incorporated herein by reference in its entirety, or any other suitable interconnect that is used in photovoltaic panels.

Figure 2:
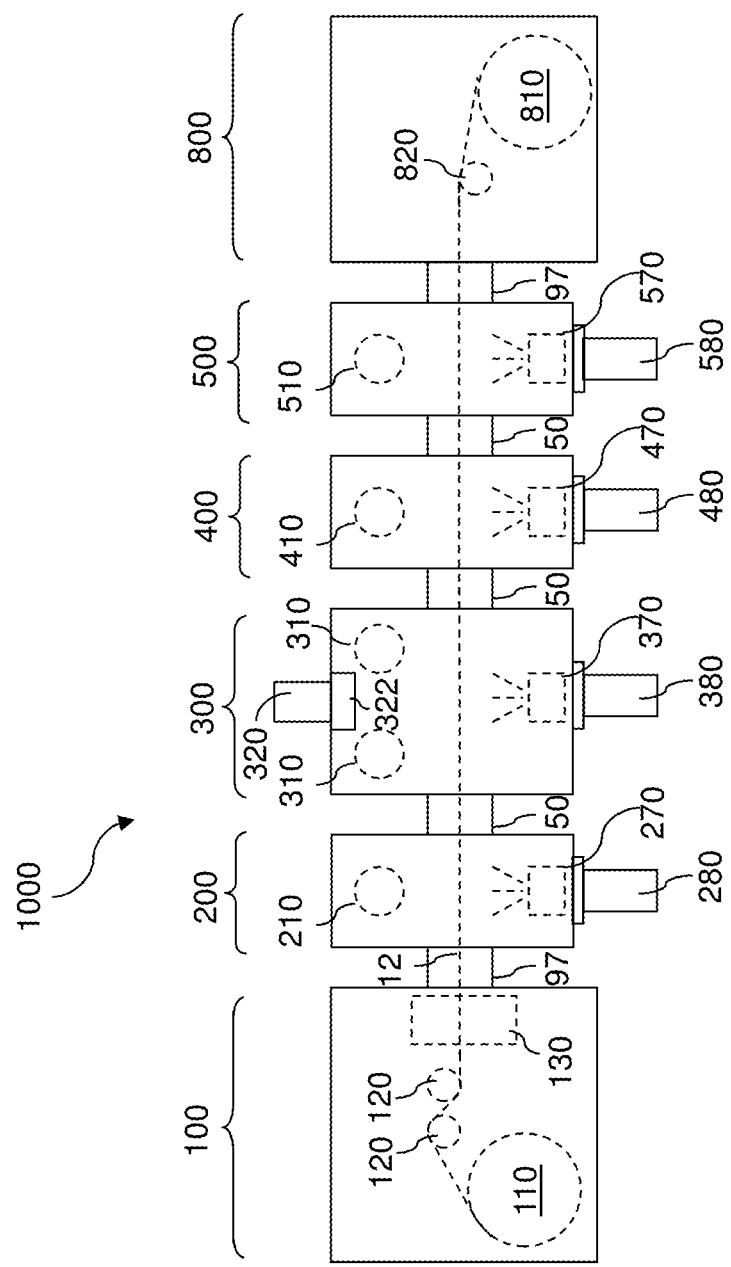
FIG. 2 is a schematic top view diagram of a first exemplary modular deposition apparatus that can be used to manufacture the photovoltaic cell illustrated in FIG. 1, according to various embodiments of the present disclosure.

Referring now to FIG. 2, an apparatus 1000 for forming the photovoltaic cell 10 illustrated in FIG. 1 is shown. The apparatus 1000 is a first exemplary modular deposition apparatus that can be used to manufacture the photovoltaic cell illustrated in FIG. 1. The apparatus 1000 includes an input unit 100, a first process module 200, a second process module 300, a third process module 400, a fourth process module 500, and an output unit 800 that are sequentially connected to accommodate a continuous flow of the substrate 12 in the form of a web foil substrate layer through the apparatus. The modules (100, 200, 300, 400, 500) may comprise sputtering modules as described in U.S. Pat. No. 9,303,316, issued on Apr. 5, 2016, incorporated herein by reference in its entirety, or any other suitable modules. The first, second, third, and fourth process modules (200, 300, 400, 500) can generate vacuum conditions using first, second, third, and fourth vacuum pumps (280, 380, 480, 580), respectively. The first, second, third, and fourth vacuum pumps (280, 380, 480, 580) can provide a suitable level of respective base pressure for each of the first, second, third, and fourth process modules (200, 300, 400, 500), which may be in a range from $1.0 \times 10^{-9}$ Torr to $1.0 \times 10^{-2}$ Torr, and preferably in range from $1.0 \times 10^{-9}$ Torr to $1.0 \times 10^{-5}$ Torr.

Each neighboring pair of process modules (200, 300, 400, 500) is interconnected employing a vacuum connection unit 50, which can include a vacuum pump and an optional slit valve that enables isolation while the substrate 12 passes through the vacuum connection unit 50. The vacuum connection units 50 are described in detail below with regard to FIG. 4.

The input unit 100 can be connected to the first process module 200 employing a sealing connection unit 97. The last process module, such as the fourth process module 500, can be connected to the output unit 800 employing another sealing connection unit 97. The sealing connection unit 97 may comprise a sealing unit as described in U.S. Pat. No. 9,303,316, issued on Apr. 5, 2016, incorporated herein by reference in its entirety, or any other suitable sealing unit.

The substrate 12 can be a metallic or polymer web foil that is fed into a system of process modules (200, 300, 400, 500) as a web for deposition of material layers thereupon to form the photovoltaic cell 10. The substrate 12 can be fed from an entry side (i.e., at the input module 100), continuously move through the apparatus 1000 without stopping, and exit the apparatus 1000 at an exit side (i.e., at the output module 800). The substrate 12, in the form of a web, can be provided on an input spool 110 provided in the input module 100.

The substrate 12, such as a metal or polymer web foil, is moved throughout the apparatus 1000 by input-side rollers 120, output-side rollers 820, and additional rollers (not shown) in the vacuum connection units 50, and/or sealing connection units 97, or other devices. Additional guide rollers may be used. Some rollers (120, 820) may be bowed to spread the web (i.e., the substrate 12), some may move to provide web steering, some may provide web tension feedback to servo controllers, and others may be mere idlers to run the web in desired positions.

The input module 100 can be configured to allow continuous feeding of the substrate 12 by adjoining multiple foils by welding, stapling, or other suitable means. Rolls of substrates 12 can be provided on multiple input spools 110. A joinder device 130 can be provided to adjoin an end of each roll of the substrate 12 to a beginning of the next roll of the substrate 12. In one embodiment, the joinder device 130 can be a welder or a stapler. An accumulator device (not shown) may be employed to provide continuous feeding of the substrate 12 into the apparatus 1000 while the joinder device 130 adjoins two rolls of the substrate 12.

In one embodiment, the input module 100 may perform pre-processing steps. For example, a pre-clean process may be performed on the substrate 12 in the input module 100. In one embodiment, the substrate 12 may pass by a heater array (not shown) that is configured to provide at least enough heat to remove water adsorbed on the surface of the substrate 12. In one embodiment, the substrate 12 can pass over a roller configured as a cylindrical rotary magnetron. In this case, the front surface of substrate 12 can be continuously cleaned by DC, AC, or RF sputtering as the substrate 12 passes around the roller/magnetron. The sputtered material from the substrate 12 can be captured on a disposable shield. Optionally, another roller/magnetron may be employed to clean the back surface of the substrate 12. In one embodiment, the sputter cleaning of the front and/or back surface of the substrate 12 can be performed with linear ion guns instead of magnetrons. Alternatively or additionally, a cleaning process can be performed prior to loading the roll of the substrate 12 into the input module 100. In one embodiment, a corona glow discharge treatment may be performed in the input module 100 without introducing an electrical bias.

The output module 800 can include an output spool 810, which winds the web embodying the photovoltaic cell 10. The photovoltaic cell 10 is the combination of the substrate 12 and the deposited layers (21, 31, 41, 51) thereupon.

In one embodiment, the substrate 12 may be oriented in one direction in the input module 100 and/or in the output module 800, and in a different direction in the process modules (200, 300, 400, 500). For example, the substrate 12 can be oriented generally horizontally in the input module 100 and the output module 800, and generally vertically in the process module(s) (200, 300, 400, 500). A turning roller or turn bar (not shown) may be provided to change the orientation of the substrate 12, such as between the input module 100 and the first process module 200. In an illustrative example, the turning roller or the turn bar in the input module can be configured to turn the web substrate 12 from an initial horizontal orientation to a vertical orientation. Another turning roller or turn bar (not shown) may be provided to change the orientation of the substrate 12, such as between the last process module (such as the fourth process module 500) and the output module 800. In an illustrative example, the turning roller or the turn bar in the input module can be configured to turn the web substrate 12 from the vertical orientation employed during processing in the process modules (200, 300, 400, 500) to a horizontal orientation.

The input spool 110 and optional output spool 810 may be actively driven and controlled by feedback signals to keep the substrate 12 in constant tension throughout the apparatus 1000. In one embodiment, the input module 100 and the output module 800 can be maintained in the air ambient at all times while the process modules (200, 300, 400, 500) are maintained at vacuum during layer deposition.

Figure 3:
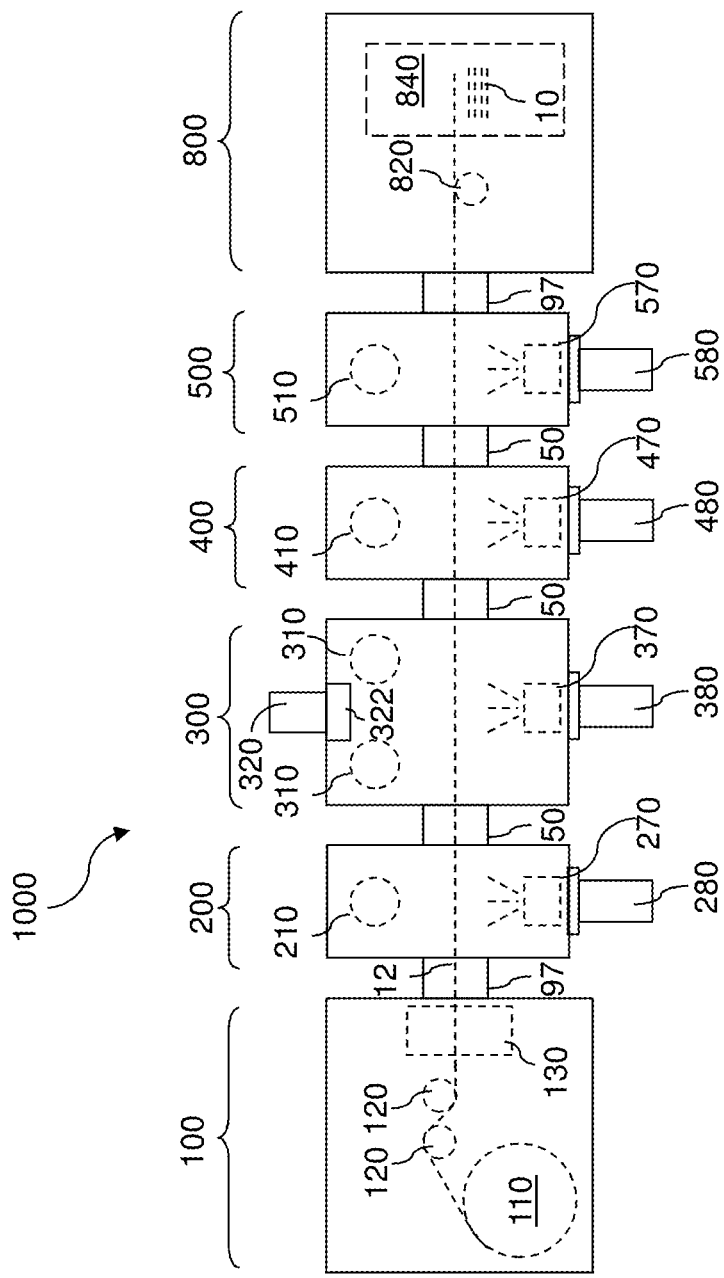
FIG. 3 is a schematic top view diagram of a second exemplary modular deposition apparatus that can be used to manufacture the photovoltaic cell illustrated in FIG. 1, according to various embodiments of the present disclosure.

FIG. 3 illustrates the modular deposition apparatus 1000 including an output module 800 comprising a cutting apparatus 840 instead of an output spool 810. The web containing the photovoltaic cells 10 can be fed into the cutting apparatus 840 in the output module 800, and can be cut into discrete sheets of photovoltaic cells 10 instead of being rolled onto an output spool 810. The discrete sheets of photovoltaic cells are then interconnected using interconnects to form a photovoltaic panel (i.e., a solar module) which contains an electrical output.

Referring back to FIGS. 2 and 3, each of the first, second, third, and fourth process modules (200, 300, 400, 500) can deposit a respective material layer to form the photovoltaic cell 10 (shown in FIG. 1) as the substrate 12 passes through the first, second, third, and fourth process modules (200, 300, 400, 500) sequentially. The modules (100, 200, 300, 400, 500) may comprise first, second, third, and fourth heaters (270, 370, 470, 570) configured to heat the substrate 12 to a corresponding appropriate deposition temperature.

Optionally, one or more additional process modules (not shown) may be added between the input module 100 and the first process module 200 to sputter a back side protective layer on the back side of the substrate 12 before deposition of the first electrode 21 in the first process module 200. Further, one or more barrier layers may be sputtered over the front surface of the substrate 12 prior to deposition of the first electrode 21. Alternatively or additionally, one or more process modules (not shown) may be added between the first process module 200 and the second process module 300 to sputter one or more adhesion layers between the first electrode 21 and the p-doped semiconductor layer 30 including a chalcogen-containing compound semiconductor material.

The first process module 200 includes a first sputtering target 210, which includes the material of the first electrode 21 in the photovoltaic cell 10 illustrated in FIG. 1. The first heater 270 can be provided to heat the web substrate 12 to an optimal temperature for deposition of the first electrode 21. In one embodiment, a plurality of first sputtering targets 210 and a plurality of first heaters 270 may be employed in the first process module 200. In one embodiment, the at least one first sputtering target 210 can be mounted on dual cylindrical rotary magnetron(s), or planar magnetron(s) sputtering targets, or RF sputtering targets. In one embodiment, the at least one first sputtering target 210 can include a molybdenum target, a molybdenum-sodium, and/or a molybdenum-sodium-oxygen target, as described in U.S. Pat. No. 8,134,069, incorporated herein by reference in its entirety.

The portion of the substrate 12 on which the first electrode 21 is deposited is moved into the second process module 300. A p-doped chalcogen-containing compound semiconductor material is deposited to form the p-doped semiconductor layer 31, such as a sodium doped CIGS absorber layer. In one embodiment, the p-doped chalcogen-containing compound semiconductor material can be deposited employing reactive alternating current (AC) magnetron sputtering in a sputtering atmosphere that includes argon and a chalcogen-containing gas at a reduce pressure. In one embodiment, multiple metallic component targets 310 including the metallic components of the p-doped chalcogen-containing compound semiconductor material can be provided in the second process module 300.

As used herein, the "metallic components" of a chalcogen-containing compound semiconductor material refers to the non-chalcogenide components of the chalcogen-containing compound semiconductor material. For example, in a copper indium gallium selenide (CIGS) material, the metallic components include copper, indium, and gallium. The metallic component targets 310 can include an alloy of all non-metallic materials in the chalcogen-containing compound semiconductor material to be deposited. For example, if the chalcogen-containing compound semiconductor material is a CIGS material, the metallic component targets 310 can include an alloy of copper, indium, and gallium. More than two targets 310 may be used. The second heater 370 can be a radiation heater that maintains the temperature of the web substrate 12 at the deposition temperature, which can be in a range from 400° C. to 800° C., such as a range from 500° C. to 700° C., which is preferable for CIGS deposition.

At least one chalcogen-containing gas source 320 (such as a selenium evaporator) and at least one gas distribution manifold 322 can be provided on the second process module 300 to provide a chalcogen-containing gas into the second process module 300. While FIGS. 2 and 3 schematically illustrate a second process module 300 including two metallic component targets 310, a single chalcogen-containing gas source 320, and a single gas distribution manifold 322, multiple instances of the chalcogen-containing gas source 320 and/or the gas distribution manifold 322 can be provided in the second process module 300.

The chalcogen-containing gas provides chalcogen atoms that are incorporated into the deposited chalcogen-containing compound semiconductor material. For example, if a CIGS material is to be deposited for the p-doped semiconductor layer 31, the chalcogen-containing gas may be selected, for example, from hydrogen selenide ($H_2Se$) and selenium vapor. In case the chalcogen-containing gas is hydrogen selenide, the chalcogen-containing gas source 320 can be a cylinder of hydrogen selenide. In case the chalcogen-containing gas is selenium vapor, the chalcogen-containing gas source 320 can be a selenium evaporator, such as an effusion cell that can be heated to generate selenium vapor.

The chalcogen incorporation during deposition of the chalcogen-containing compound semiconductor material determines the properties and quality of the chalcogen-containing compound semiconductor material in the p-doped semiconductor layer 31. When the chalcogen-containing gas is supplied in the gas phase at an elevated temperature, the chalcogen atoms from the chalcogen-containing gas can be incorporated into the deposited film by absorption and subsequent bulk diffusion. This process is referred to as chalcogenization, in which complex interactions occur to form the chalcogen-containing compound semiconductor material. The p-type doping in the p-doped semiconductor layer 31 is induced by controlling the degree of deficiency of the amount of chalcogen atoms with respect the amount of non-chalcogen atoms (such as copper atoms, indium atoms, and gallium atoms in the case of a CIGS material) deposited from the metallic component targets 310.

In one embodiment, each metallic component target 310 can be employed with a respective magnetron (not expressly shown) to deposit a chalcogen-containing compound semiconductor material with a respective composition. In one embodiment, the composition of the metallic component targets 310 can be gradually changed along the path of the substrate 12 so that a graded chalcogen-containing compound semiconductor material can be deposited in the second process module 300. For example, if a CIGS material is deposited as the chalcogen-containing compound semiconductor material of the p-doped semiconductor layer 31, the atomic percentage of gallium of the deposited CIGS material can increase as the substrate 12 progresses through the second process module 300. In this case, the p-doped CIGS material in the p-doped semiconductor layer 31 of the photovoltaic cell 10 can be graded such that the band gap of the p-doped CIGS material increases with distance from the interface between the first electrode 21 and the p-doped semiconductor layer 31.

In one embodiment, the total number of metallic component targets 310 may be in a range from 3 to 20. In an illustrative example, the composition of the deposited chalcogen-containing compound semiconductor material (e.g., the p-doped CIGS material absorber 31) can be graded such that the band gap of the p-doped CIGS material varies (e.g., increases or decreases gradually or in steps) with distance from the interface between the first electrode 21 and the p-doped semiconductor layer 31. For example, the band gap can be about 1 eV at the interface with the first electrode 21, and can be about 1.3 eV at the interface with subsequently formed n-doped semiconductor layer 41.

The second process module 300 includes a deposition system for deposition of a chalcogen-containing compound semiconductor material for forming the p-doped semiconductor layer 31. As discussed above, the deposition system includes a vacuum enclosure attached to a vacuum pump (such as at least one second vacuum pump 380), and a sputtering system comprising at least one sputtering target (such as the at least one metallic component target 310, for example a Cu—In—Ga target) located in the vacuum enclosure and at least one respective magnetron. The sputtering system is configured to deposit a material including at least one component of a chalcogen-containing compound semiconductor material (i.e., the non-chalcogen metallic component(s) of the chalcogen-containing compound semiconductor material) over the substrate 12 in the vacuum enclosure. In other words, the module 300 is a reactive sputtering module in which the chalcogen gas (e.g., selenium vapor) from gas distribution manifolds 322 reacts with the metal (e.g., Cu—In—Ga) sputtered from the targets 310 to form the chalcogen-containing compound semiconductor material (e.g., CIGS) layer 31 over the substrate 12.

In an illustrative example, the chalcogen-containing compound semiconductor material can comprise a copper indium gallium selenide, and the at least one sputtering target (i.e., the metallic component targets 310) can comprise materials selected from copper, indium, gallium, and alloys thereof (e.g., Cu—In—Ga alloy, CIG). In one embodiment, the chalcogen-containing gas source 320 can be configured to supply a chalcogen-containing gas selected from gas phase selenium and hydrogen selenide ($H_2Se$). In one embodiment, the chalcogen-containing gas can be gas phase selenium, i.e., vapor phase selenium, which is evaporated from a solid source in an effusion cell.

While the present disclosure is described employing an embodiment in which metallic component targets 310 are employed in the second process module 300, embodiments are expressly contemplated herein in which each, or a subset, of the metallic component targets 310 is replaced with a pair of two sputtering targets (such as a copper target and an indium-gallium alloy target), or with a set of three supper targets (such as a copper target, an indium target, and a gallium target).

Generally speaking, the chalcogen-containing compound semiconductor material can be deposited by providing a substrate 12 in a vacuum enclosure attached to a vacuum pump 380, providing a sputtering system comprising at least one sputtering target 310 located in the vacuum enclosure and at least one respective magnetron located inside a cylindrical target 310 or behind a planar target (not explicitly shown), and providing a gas distribution manifold 322 having a supply side and a distribution side. The chalcogen-containing compound semiconductor can be deposited by sputtering a material including at least one component (i.e., the non-chalcogen component) of a chalcogen-containing compound semiconductor material onto the substrate 12 while flowing a chalcogen-containing gas (e.g., Se vapor) into the vacuum chamber through the gas distribution manifold 322.

The portion of the substrate 12 on which the first electrode 21 and the p-doped semiconductor layer 31 are deposited is subsequently passed into the third process module 400. An n-doped semiconductor material is deposited in the third process module 400 to form the n-doped semiconductor layer 41 illustrated in the photovoltaic cell 10 of FIG. 1. The third process module 400 can include, for example, a third sputtering target 410 (e.g., a CdS target) and a magnetron (not expressly shown). The third sputtering target 410 can include, for example, a rotary or planar magnetron powered by AC, RF, DC or Pulsed DC.

The portion of the substrate 12 on which the first electrode 21, the p-doped semiconductor layer 31, and the n-doped semiconductor layer 41 are deposited is subsequently passed into the fourth process module 500. A transparent conductive oxide material is deposited in the fourth process module 500 to form the second electrode comprising a transparent conductive layer 51 illustrated in the photovoltaic cell 10 of FIG. 1. The fourth process module 500 can include, for example, a fourth sputtering target 510 and a magnetron (not expressly shown). The fourth sputtering target 510 can include, for example, a ZnO, AZO or ITO target and a rotary or planar magnetron powered by AC, RF, DC or Pulsed DC. A transparent conductive oxide layer 51 is deposited over the material stack (31, 41) including the p-n junction. In one embodiment, the transparent conductive oxide layer 51 can comprise a material selected from tin-doped indium oxide, aluminum-doped zinc oxide, and zinc oxide. In one embodiment, the transparent conductive oxide layer 51 can have a thickness in a range from 60 nm to 1,800 nm.

Subsequently, the web substrate 12 passes into the output module 800. The substrate 12 can be wound onto the output spool 810 (which may be a take up spool) as illustrated in FIG. 2, or can be sliced into photovoltaic cells using a cutting apparatus 840 as illustrated in FIG. 3.

Substrate Guidance

In various embodiments, it may be beneficial to arrange the deposition apparatus 1000 in a non-linear configuration. For example, the deposition apparatus 1000 may be arranged in a non-linear configuration to fit within a particular manufacturing facility and/or to improve convenience of operation. For example, in some embodiments, one or more of the modules (100, 200, 300, 400, 500, 800) the deposition apparatus 1000 may be arranged such that the substrate 12 travels along a non-linear (e.g., curved) path, such as a generally C-shaped or U-shaped path, during the deposition process. Each of the modules (200, 300, 400, 500) may be positioned at an angle ranging from 10° to 40°, such as from 25° to 35°, or from 27° to 32°, with respect to an adjacent process module. Accordingly, the vacuum connection units 50 may include elements, such as rollers, configured to change the direction of (e.g., bend) the substrate 12 as the substrate 12 passes through the apparatus 1000.

The tension applied to the substrate 12 may vary in different portions thereof and/or across the width thereof. For example, edge regions of the substrate 12 may have less tension than a central region thereof. Accordingly, portions of the substrate 12 may become deformed (e.g., may sag and assume a nonplanar configuration) due to insufficient tension. For example, one or both edge regions of a substrate may sag out of plane with the central region.

In addition, as the substrate 12 moves through the deposition modules (200, 300, 400, 500) the substrate 12 may be heated to a high temperature, and the substrate 12 may cool to room temperature when passing through the vacuum connection units 50. Accordingly, the size of the substrate 12 may change due to thermal expansion and contraction, especially if there are no rollers in the high temperature modules (200, 300, 400, 500). In particular, the width of the substrate 12 may increase during the heating, which may further reduce the width-wise tension applied thereto. This may further increase out of plane sagging or buckling of the substrate 12.

In a conventional vacuum connection unit, relatively small diameter rollers may be used to change the direction of a substrate. However, as a heated and/or sagging substrate is bent around such a roller, creases and/or folds may be formed in buckled or baggie regions of the substrate, due at least in part to the small radius of curvature of the roller. As a result, the substrate may be damaged and system yields may be reduced. This problem may be especially acute for rollers disposed in close proximity to the output of deposition modules.

In order to address this problem, the radius of curvature may be increased by increasing the diameter of a roller and/or the tension applied to a substrate may be reduced. However, large diameter rollers generally must be housed in a correspondingly large chamber, which may result in a substantial increase in the overall size of a deposition apparatus. Further, system size constraints may prohibit the use of such large diameter rollers. In addition, the tension reductions may result in other process problems, such as substrate sagging, non-uniform deposition, and/or substrate damage. Accordingly, there is a need for an improved roller assembly to overcome these and/or other problems and bend a substrate.

Figure 4A:
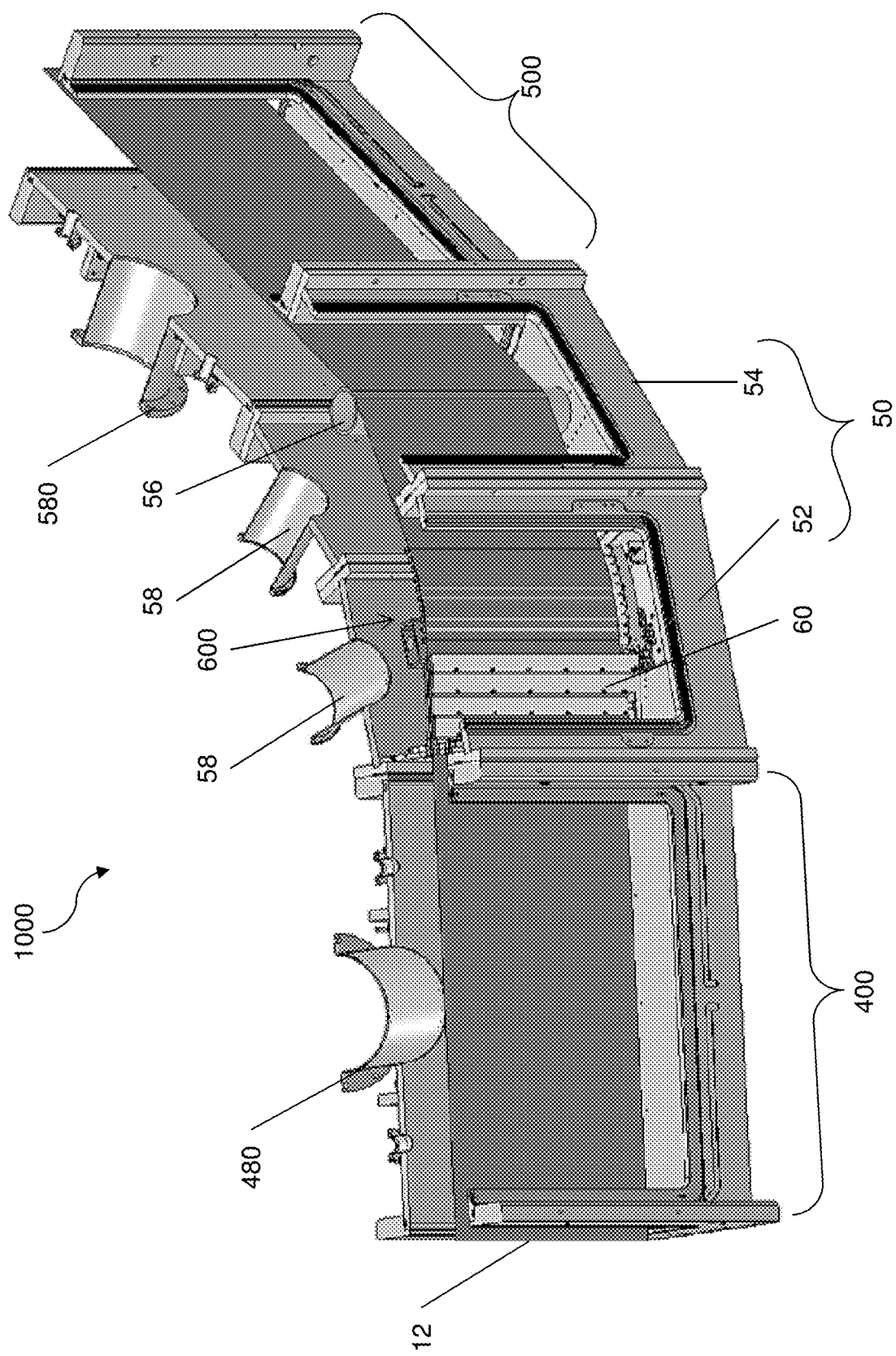
FIG. 4A is a perspective view of adjacent process modules 400, 500 and the corresponding connection unit 50 of the modular deposition apparatus 1000, when arranged in a non-linear configuration, according to various embodiments of the present disclosure.
Figure 4B:
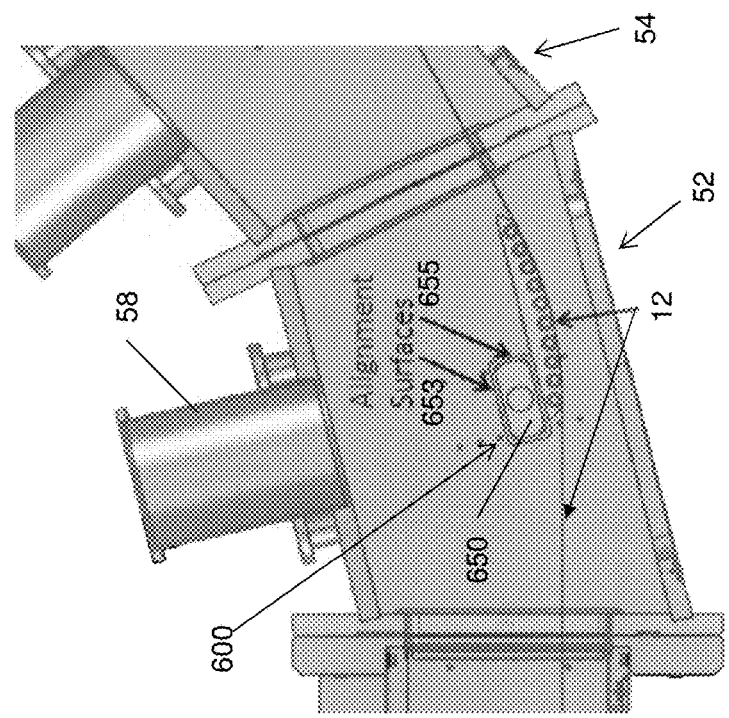
FIG. 4B is a top view of a first vacuum chamber 52 of the connection unit 50.

FIG. 4A is a perspective view of adjacent process modules 400, 500 and the corresponding connection unit 50 of the modular deposition apparatus 1000, when arranged in a non-linear configuration such that the substrate 12 curves by more than about 5° between adjacent process modules, according to various embodiments of the present disclosure. FIG. 4B is a top view of a first vacuum chamber 52 of the connection unit 50.

Referring to FIGS. 4A and 4B, the modules 400, 500 are shown to be are disposed at a non-zero angle, e.g., an angle ranging from 10° to 40°, such as from 25° to 35°, or from 27° to 32°, with respect to an adjacent process module, such that the substrate 12 moves through the modules 400, 500 in different directions. However, any and/or all modules (100, 200, 300, 400, 500, 800) included in the apparatus 1000 may be disposed in a similar angular arrangement with a non-zero angle and vacuum connection unit 50 disposed therebetween.

The vacuum connection unit 50 may be configured to bend the substrate 12, such that the substrate 12 is aligned with module 500, after exiting module 400. The first vacuum chamber 52 may be disposed adjacent to module 400, and the second vacuum chamber 54 may be disposed adjacent to module 500. While the connection unit 50 is shown to include two vacuum chambers 52, 54, the present disclosure is not limited thereto. For example, in other embodiments, a single vacuum chamber or three or more vacuum chambers may be included in the connection unit 50.

The connection unit 50 may include a roller assembly 600 in the first chamber 52 and a single cylindrical roller 56 in the second chamber 54. However, in some embodiments, the roller assembly 600 may be included in both of the first and second chambers 52, 54, or only in the second chamber 54. Each chamber 52, 54 may also include a vacuum pump 58, (shown schematically in FIG. 4A as a cut away portion of vacuum pump conduit or housing) to maintain vacuum conditions therein. The first chamber 52 may also include a conductance limiter 60 (e.g., a parallel plate limiter).

The roller assembly 600 and the roller 56 may both be configured to bend the substrate 12 to change the direction of the substrate 12. However, the radius of curvature imparted to the substrate 12 by the roller assembly 600 may be substantially greater than the radius of curvature imparted by the roller 56.

For example, the roller assembly 600 may be configured to bend the substrate 12, such that a portion of the substrate 12 in contact with the roller assembly 600 has a radius of curvature of at least about 10", such as from about 15" to about 25", or from about 17" to about 22" to bend the substrate 12 by an angle of about 10° to about 40°, such as from about 25° to about 35°, e.g., from about 27° to about 32°. In contrast, the roller 56 may be configured to bend the substrate 12, such that a portion of the substrate 12 in contact with the roller 56 has a radius of curvature ranging from about 1" to about 4", such as from about 1.5" to about 3", or from about 2" to about 2.5".

Figure 5A:
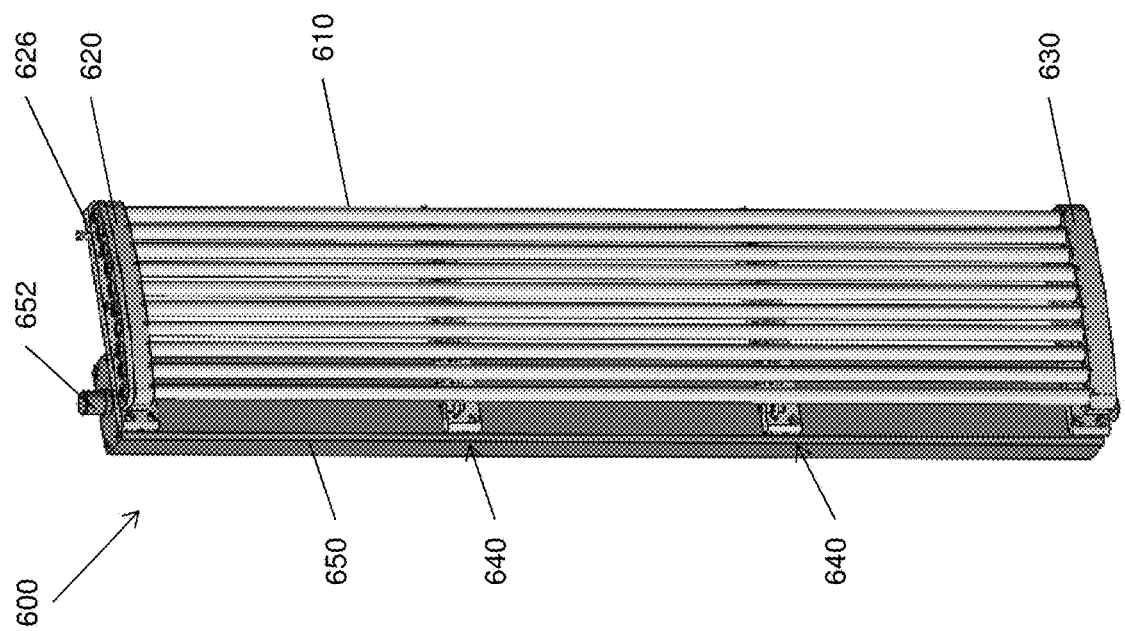
FIG. 5A is a perspective view of the roller assembly 600.
Figure 5B:
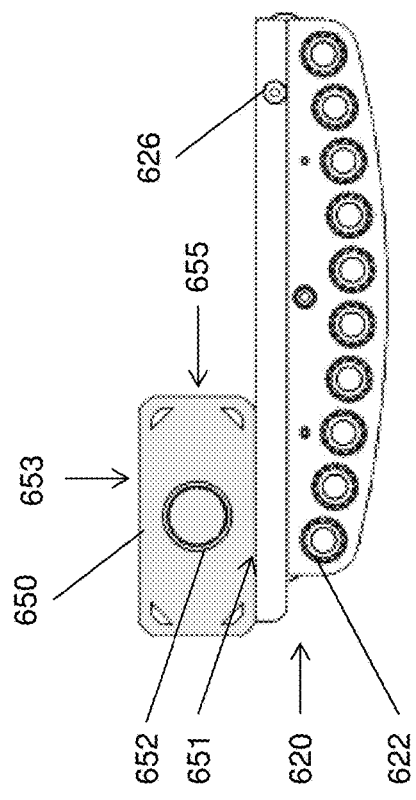
FIG. 5B is a top view of the roller assembly 600.
Figure 5C:
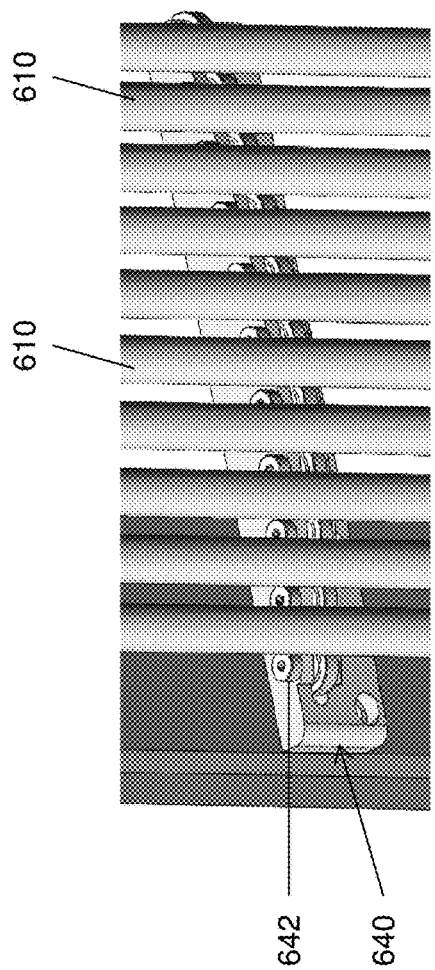
FIG. 5C is an enlarged view of a support bracket 640 of FIG. 5A.
Figure 5D:
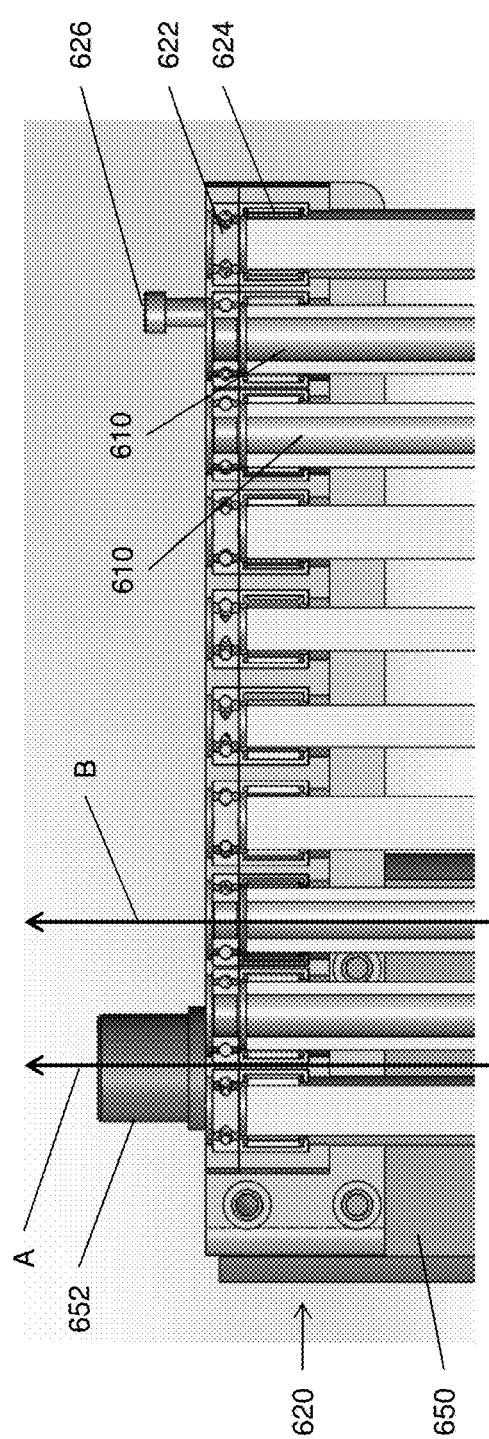
FIG. 5D is a sectional view of an upper bracket 620 of FIG. 5A.
Figure 5E:
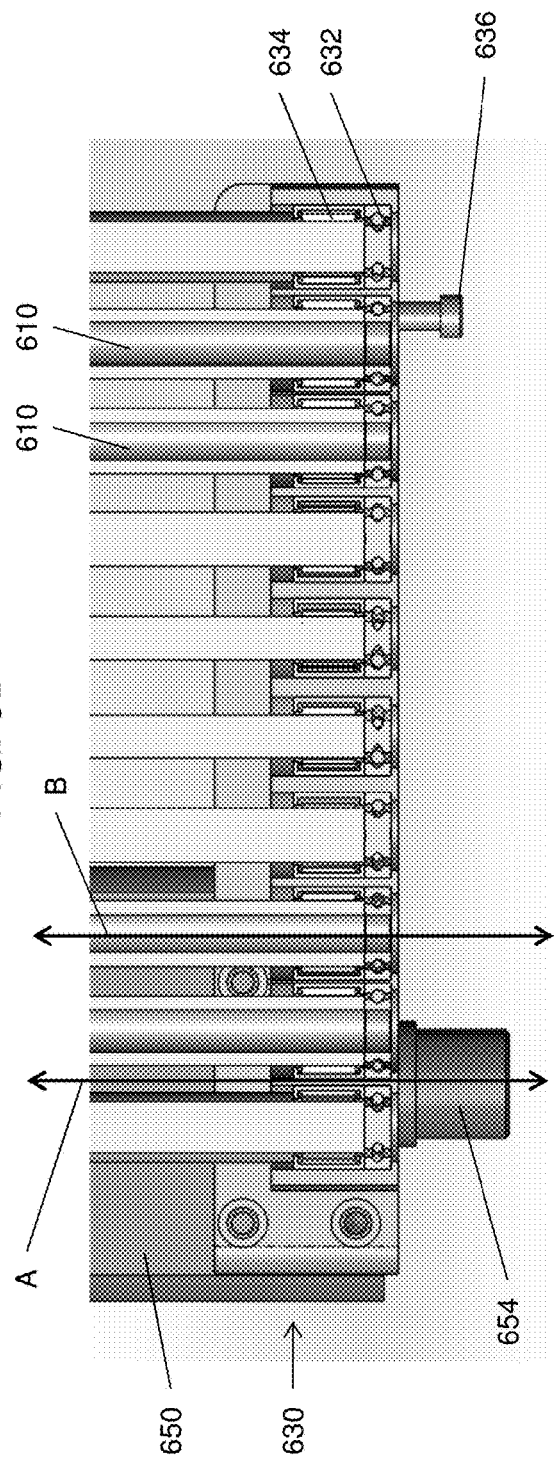
FIG. 5E is a sectional view of a lower bracket 630 of FIG. 5A.

FIG. 5A is a perspective view of the roller assembly 600, FIG. 5B is a top view of the roller assembly 600, and FIG. 5C is an enlarged view of a support bracket 640 of FIG. 5A. FIG. 5D is a sectional view of an upper bracket 620 of FIG. 5A, and FIG. 5E is a sectional view of a lower bracket 630 of FIG. 5A.

Referring to FIGS. 5A-5E, the roller assembly 600 includes multiple small-diameter rollers 610, the upper bracket 620, the lower bracket 630, one or more of the support brackets 640, and support structure such as a support beam 650. While the support beam 650 is described below, the present disclosure is not so limited, and any suitable support structure may be utilized, such as a plate, mesh, multiple beams, etc. The support beam 650 may be substantially rectangular and may include an upper alignment post 652 and a lower alignment post 654. The support beam 650 may have an axis of rotation A that extends through the alignment posts 652, 654, and can be moved in X and/or Y directions perpendicular to the alignment surfaces 653, 655 by moving the posts 652, 654.

The upper bracket 620 may be attached to an upper end of the support beam 650, the lower bracket 630 may be attached to an opposing lower end of the support beam 650, and the support brackets 640 may be attached to the support beam 650 between the upper and lower brackets 620, 630. In particular, the brackets 620, 630, 640 may be attached to a substantially planar first surface 651 of the support beam 650. The support beam 650 may also include planar alignment surfaces 653, 655 that may be substantially orthogonal to one another. The alignment surfaces 653, 655 can be used to align the rollers 610 in the assembly 600 all at once, thus simplifying the alignment process. The brackets 620, 630, 640 may be attached to the support beam 650 by any suitable method, such as by using bolts, rivets, welding, or the like.

In some embodiments, the rollers 610 may have a diameter smaller than that of the roller 56, such as a diameter ranging from about 0.25" to about 1.75", such as from about 0.5" to about 1.25", or from about 0.6" to about 0.75". The rollers 610 may include a low-friction outer surface configured to contact the substrate 12. In some embodiments, the roller assembly 600 may include at least 6 or at least 8 rollers 610. For example, the roller assembly 600 may include from 6 to 20 rollers, such as from 8 to 15 rollers, or from 10 to 14 rollers. However, the roller assembly 600 may include any suitable number of rollers 610 that is sufficient to bend and reduce and/or prevent damage to the substrate 12. Each roller 610 is preferably cylindrical and has an axial height greater than the width of the substrate 12.

The upper and lower ends of the rollers 610 may be respectively connected to the upper and lower brackets 620, 630. In particular, the upper bracket 620 may include first bearings 622, such as ball bearings, and second bearings 624, such as needle roller bearings. The lower bracket 630 may include first bearings 632, such as ball bearings, and second bearings 634, such as needle roller bearings. The first bearings 622, 632 may be configured to bear an axial load applied to the rollers 610, and the second bearings 624, 634 may be configured to bear a radial load applied to the rollers 610. The upper bracket 620 may also include an upper alignment post 626, and the lower bracket 630 may include a lower alignment post 636.

The rollers 610 may be configured to simultaneously contact the substrate 12 and may be arranged on the upper and lower brackets 620, 630 in an arc, such that a portion of the substrate 12 that contacts the rollers 610 is bent by the roller assembly 600 as described above. The arc may have a radius of curvature corresponding to the radius of curvature of the roller assembly 600, as described above. For example, the rollers 610 may be configured to bend a portion of the substrate 12 by an angle of about 10° to about 40°, such as from about 25° to about 35°, e.g., from about 27° to about 32°, such that the portion has a radius of curvature of at least about 10", such as a radius of curvature ranging from about 10" to about 25", from about 12" to about 22", from about 15" to about 20", from about 16" to about 19", or from about 17.25" to about 17.75". The rollers 610 may be arranged such that an axis of rotation B of each roller 610 is substantially parallel to the axis of rotation A of the support beam 650. This allows the alignment between axes A and B to be controlled mechanically and for the rollers 610 to be aligned off the beam 650.

The support brackets 640 may be configured to support the rollers 610 between the upper and lower brackets 620, 630. In particular, the support brackets 640 may include bearings 642 configured to contact respective rollers 610. The bearings 642 may be arranged on each support bracket 640 in an arc corresponding to the arc of the rollers 610. Accordingly, the support brackets 640 may be configured to reduce or prevent bending (e.g., flexing) of the rollers 610 while the rollers 610 rotate against a substrate. If the roller assembly 600 includes two or more support brackets 640, the support brackets 640 may be disposed equidistantly from one another and from the upper and lower brackets 620, 630. If the roller assembly 600 includes only one support brackets 640, the support bracket 640 may be disposed equidistantly between the upper and lower brackets 620, 630.

FIG. 6A is a schematic view showing the connection of the upper alignment post 652 and the vacuum chamber 52, FIG. 6B is a schematic view showing the connection of the lower alignment post 654 and the vacuum chamber 52, and FIG. 6C is a perspective view of a lower post bracket 670 and a bottom portion of the roller assembly 600, according to various embodiments of the present disclosure. Referring to FIGS. 6A-6C, an upper post bracket 660 may be fixed to a top wall of the vacuum chamber 52, and a lower post bracket 670 may be fixed to a bottom wall of the vacuum chamber 52. In some embodiments, the upper post bracket 660 may extend through the roof of the chamber 52 to be connected to an actuator that moves the upper post bracket 660 and the support beam 650 in X and Y directions and/or rotates the support beam 650 about axis A.

The upper post bracket 660 may include a bearing 662 configured to receive the upper alignment post 652. The lower post bracket 670 may include a bearing 672 configured to receive the lower alignment post 654. The bearings 662, 672 may be configured to permit easy rotation of the support beam 650 around the rotational axis A. In some embodiments, the bearings 662, 672 may be self-aligning bearings, which may facilitate installation of the support beam 650.

In some embodiments, the lower post bracket 670 may include an X adjustment device 674 configured to move the bearing 672 and the lower alignment post 654 in an X direction, and a Y adjustment device 676 configured to move the bearing 672 and the lower alignment post 654 in a perpendicular Y direction. The X and Y directions may be substantially perpendicular to the rotational axis A of the support beam 650. The adjustment devices 674, 676 may be used to move the lower alignment post 654 in the X and Y directions, and thereby adjust the orientation of the rotation axis A with respect to the vacuum chamber 52. Therefore, the adjustment devices 674, 676 may be used, alone or in combination with the upper post bracket 660, to manually or automatically align the rollers 610, such that the rotational axes B thereof are substantially perpendicular to a movement direction of a substrate through the vacuum chamber 52. The adjustment devices 674, 676 may be operated manually or may be machine operated. In other embodiments, the adjustment devices 674, 676 may be alternatively or additionally included in the upper post bracket 660.

FIG. 7A is a perspective view showing an upper adjustment mechanism 680 for the upper bracket 620, FIG. 7B is a perspective view showing a lower adjustment mechanism 690 for the lower bracket 630, and FIG. 7C is another perspective view showing an adjustment mechanism for the lower bracket 630, according to various embodiments of the present disclosure. Referring to FIGS. 7A-7C, the upper adjustment mechanism 680 may be configured to adjust the position of the upper bracket 620, by controlling the rotation of the upper bracket 620 with respect to the axis of rotation A of the support beam 650. The lower adjustment mechanism 690 may be configured to adjust the position of the lower bracket 630, by controlling the rotation of the lower bracket 630 with respect to the axis of rotation A of the support beam 650. Accordingly, the adjustment mechanisms 680, 690 determine the number of rollers 610 which engage with the web. Adjustment of both 680 and 690 is needed to provide strength to the assembly when web tension is applied. If only one mechanism 680 or 690 was employed the entire roller assembly 600 might bend or twist about axes A.

In various embodiments, the upper adjustment mechanism 680 may include an adjustment bracket 682 and an adjustment rod 684. The adjustment bracket 682 may be attached to a top wall of the vacuum chamber 52. The adjustment rod 684 may be attached to the upper alignment post 626 and the adjustment bracket 682. For example, the adjustment rod 684 may be a threaded bolt, and one end of the adjustment rod 684 may extend through the adjustment bracket 682 and be threaded into a nut 686, and the upper alignment post 626 may contact or be inserted into an opposing end of the adjustment rod 684. The adjustment rod 684 may be configured to rotate, such that the upper bracket 620 is moved toward or away from the adjustment bracket 682.

In various embodiments, the lower adjustment mechanism 690 may include a lower adjustment bracket 692 and an adjustment rod 694. The lower adjustment bracket 692 may be attached to a bottom wall of the vacuum chamber 52. The adjustment rod 694 may be attached to the lower alignment post 636 and may contact or be attached to the lower adjustment bracket 692. For example, the rod 694 may be a threaded bolt, and one end of the adjustment rod 694 may extend through the adjustment bracket 692 and be threaded into a nut 696, and the lower alignment post 636 may contact or be inserted into an opposing end of the adjustment rod 694. The adjustment rod 694 may be configured to rotate, such that the lower bracket 630 is moved toward or away from the lower adjustment bracket 692.

Figure 8:
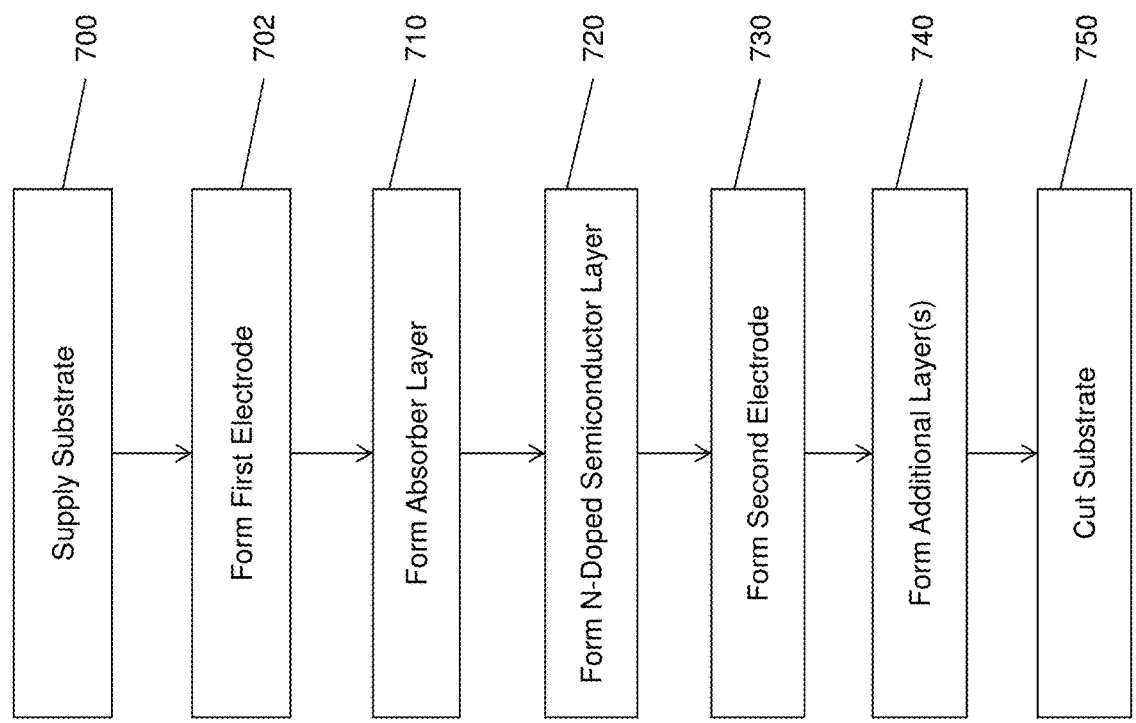
FIG. 8 is a block diagram illustrating a sputter deposition method, according to various embodiments of the present disclosure.

FIG. 8 is a block diagram illustrating a sputter deposition method according to various embodiments of the present disclosure. The method may involve using a deposition system as discussed above with regard to FIGS. 2 and 3, with the deposition system including at least one roller assembly as discussed above with regard to FIGS. 4-7C.

Referring to FIGS. 2, 3, and 8, in step 700, the method may include supplying a substrate, such as a magnetic substrate, from an input spool in an input module to a vacuum deposition chamber of a deposition module. In particular, the substrate may be moved through a sealing connection unit connecting the input module to the deposition module.

The sealing connection unit may include isolation chambers connected by parallel plate conductance limiters. One or more of the conductance limiters may include a first plate that faces a front surface of the substrate and an opposing second plate.

In step 702, the method may include forming a first or back side electrode on the front side of the substrate. For example, the first electrode may be deposited on the substrate while the substrate moves through the first process module 200.

In step 710, an absorber layer (i.e., p-doped semiconductor layer) may be formed on the first electrode. For example, the absorber layer may be deposited on the substrate while the substrate moves through the second process module 300.

In step 720, an n-doped semiconductor layer may be formed on the absorber layer. For example, the n-doped semiconductor layer may be deposited on the substrate while the substrate moves through the third process module 400.

In step 730, a second electrode may be formed on an n-doped semiconductor layer. For example, the second electrode may be deposited on the substrate while the substrate moves through the fourth process module 500.

The method may optionally include step 740 in which additional layers may be formed on the substrate. For example, optional step 740 may include forming an anti-reflection layer and/or a protective layer on the substrate.

Steps 710, 720, 730, and/or 740 may include using roller assemblies 600 to receive the substrate 12 from the previous deposition module and redirect the substrate to the corresponding deposition module, as described above. For example, the substrate 12 may be contacted by roller assemblies 600 disposed in any of the vacuum connection units 50.

In step 750, the substrate 12 may be cut into individual solar cells. In particular, the substrate 12 may be provided from a deposition module to an output module including a substrate cutter, via a sealing connection unit. The sealing connection unit may include isolation chambers connected by parallel plate conductance limiters including one or more magnetic substrate guides, to prevent damage to the front surface of the substrate, as described above with regard to step 702.

While sputtering was described as the preferred method for depositing all layers onto the substrate, some layers may be deposited by MBE, CVD, evaporation, plating, etc.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the photovoltaic cells of the present invention.

What is claimed is:

1. A thin film deposition system comprising:
   first and second process modules configured to form a film on a substrate comprising a web substrate having a width and configured to move through the first and second process modules in a direction perpendicular to the width;
   a connection unit configured to receive the substrate from the first process module at a first angle and provide the substrate to the second process module at a second angle different from the first angle, the connection unit comprising a first vacuum chamber configured to receive the substrate from the first process module; and
   a roller assembly disposed in the first vacuum chamber and configured to bend a portion of the substrate as the substrate moves through the first vacuum chamber, the roller assembly comprising:
      a rotatable and laterally movable support disposed in the first vacuum chamber; and
      cylindrical rollers supported by the support, wherein the rollers have a first axis of rotation parallel to the width of the substrate, and wherein the rollers are arranged in an arc having a radius of curvature of at least about 10", such that the bent portion of the substrate is configured to have radius of curvature of at least about 10";
   wherein:
      the support comprises a support beam which has a second axis of rotation that is parallel to the first axis of rotation of the cylindrical rollers;
      an upper bracket is attached to an upper end of the support beam;
      a lower bracket is attached to a lower end of the support beam; and
      each of the rollers extends from the upper bracket to the lower bracket and configured to simultaneously contact the bent portion of the substrate;
   wherein the roller assembly further comprises:
      a first support bracket attached to the support beam between the upper and lower brackets, the first support bracket comprising bearings configured to respectively support the rollers; and
      a second support bracket attached to the support beam between the upper and lower brackets, the second support bracket comprising bearings configured to respectively support the rollers.

2. The system of claim 1, wherein the support beam comprises an upper alignment post extending from the upper end of the support beam and a lower alignment post extending from the lower end of the support beam.

3. A thin film deposition system comprising:
   first and second process modules configured to form a film on a substrate comprising a web substrate having a width and configured to move through the first and second process modules in a direction perpendicular to the width;
   a connection unit configured to receive the substrate from the first process module at a first angle and provide the substrate to the second process module at a second angle different from the first angle, the connection unit comprising a first vacuum chamber configured to receive the substrate from the first process module; and
   a roller assembly disposed in the first vacuum chamber and configured to bend a portion of the substrate as the substrate moves through the first vacuum chamber, the roller assembly comprising:
      a rotatable and laterally movable support disposed in the first vacuum chamber; and
      cylindrical rollers supported by the support, wherein the rollers have a first axis of rotation parallel to the width of the substrate, and wherein the rollers are arranged in an arc having a radius of curvature of at least about 10", such that the bent portion of the substrate is configured to have radius of curvature of at least about 10";
   wherein:
      the support comprises a support beam which has a second axis of rotation that is parallel to the first axis of rotation of the cylindrical rollers;
      an upper bracket is attached to an upper end of the support beam;
      a lower bracket is attached to a lower end of the support beam; and
      each of the rollers extends from the upper bracket to the lower bracket and configured to simultaneously contact the bent portion of the substrate;
   wherein the support beam comprises an upper alignment post extending from the upper end of the support beam and a lower alignment post extending from the lower end of the support beam; and
   further comprising:
      an upper post bracket attached to a top wall of the first vacuum chamber;
      a lower post bracket attached to a bottom wall of the first vacuum chamber; and
      first and second bearings respectively configured to receive the upper and lower post brackets, such that the support beam is rotatable within the vacuum chamber around the second axis of rotation.

4. The system of claim 3, wherein the first and second bearings are self-aligning bearings.

5. The system of claim 3, wherein at least one of the upper and lower post brackets comprises:
   an X adjustment device configured to move the support beam in an X direction; and
   a Y adjustment device configured to move support beam in a Y direction that is substantially perpendicular to the X direction,
   wherein the X and Y directions are substantially perpendicular to the second axis of rotation of the support beam.

6. The system of claim 5, further comprising:
   an upper adjustment mechanism connecting the upper bracket to the vacuum chamber; and
   a lower adjustment mechanism connecting the lower bracket to the vacuum chamber, wherein the upper and lower adjustment mechanisms are configured to control an amount of engagement applied between the substrate and the rollers, by respectively controlling a rotation of the upper and lower brackets with respect to the second axis of rotation of the support beam.

7. The system of claim 6, wherein:

the upper bracket comprises an upper alignment post;

the lower bracket comprises a lower alignment post;

the upper adjustment mechanism comprises:
- an upper adjustment bracket attached to the upper wall of the housing; and
- an upper adjustment rod connected to the upper adjustment bracket and the upper alignment post; and the lower adjustment mechanism comprises:
- a lower adjustment bracket attached to the lower wall of the housing; and
- a lower adjustment rod connected to the lower adjustment bracket and the lower alignment post.

8. A thin film deposition system comprising:

first and second process modules configured to form a film on a substrate comprising a web substrate having a width and configured to move through the first and second process modules in a direction perpendicular to the width;

a connection unit configured to receive the substrate from the first process module at a first angle and provide the substrate to the second process module at a second angle different from the first angle, the connection unit comprising a first vacuum chamber configured to receive the substrate from the first process module; and a roller assembly disposed in the first vacuum chamber and configured to bend a portion of the substrate as the substrate moves through the first vacuum chamber, the roller assembly comprising:
- a rotatable and laterally movable support disposed in the first vacuum chamber; and
- cylindrical rollers supported by the support, wherein the rollers have a first axis of rotation parallel to the width of the substrate, and wherein the rollers are arranged in an arc having a radius of curvature of at least about 10", such that the bent portion of the substrate is configured to have radius of curvature of at least about 10";

wherein:

the support comprises a support beam which has a second axis of rotation that is parallel to the first axis of rotation of the cylindrical rollers;

an upper bracket is attached to an upper end of the support beam;

a lower bracket is attached to a lower end of the support beam; and each of the rollers extends from the upper bracket to the lower bracket and configured to simultaneously contact the bent portion of the substrate;

wherein the upper and lower brackets each comprise:
- first bearings configured to bear an axial load applied to the rollers; and
- second bearings configured to bear a radial load applied to the rollers.

9. The system of claim 8, wherein:

the first bearings comprise ball bearings; and the second bearings comprise needle bearings.

* * * * *